United States Patent
Alpert et al.

(10) Patent No.: US 8,954,912 B2
(45) Date of Patent: Feb. 10, 2015

(54) STRUCTURED PLACEMENT OF LATCHES/FLIP-FLOPS TO MINIMIZE CLOCK POWER IN HIGH-PERFORMANCE DESIGNS

(71) Applicant: International Business Machines Corporation, Armonk, NY (US)

(72) Inventors: Charles J. Alpert, Austin, TX (US); Zhuo Li, Cedar Park, TX (US); Gi-Joon Nam, Austin, TX (US); Shyam Ramji, Lagrangeville, NY (US); Chin Ngai Sze, Austin, TX (US); Paul G. Villarrubia, Austin, TX (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,437

(22) Filed: Nov. 29, 2012

(65) Prior Publication Data

US 2014/0149957 A1    May 29, 2014

(51) Int. Cl.
  *G06F 17/50*    (2006.01)
(52) U.S. Cl.
  CPC .................................. *G06F 17/5072* (2013.01)
  USPC .......................................... 716/122; 716/123
(58) Field of Classification Search
  USPC .................................................. 716/119–125
  See application file for complete search history.

(56) References Cited

U.S. PATENT DOCUMENTS

| | | | |
|---|---|---|---|
| 6,920,625 B2 | 7/2005 | Gass | |
| 7,020,861 B2 | 3/2006 | Alpert et al. | |
| 7,549,137 B2 | 6/2009 | Alpert et al. | |
| 7,624,366 B2 | 11/2009 | Alpert et al. | |
| 7,774,732 B2 * | 8/2010 | KleinOsowski et al. | 716/119 |
| 8,104,014 B2 | 1/2012 | Puri et al. | |
| 2008/0148203 A1 * | 6/2008 | Alpert et al. | 716/6 |
| 2008/0184184 A1 | 7/2008 | McCracken et al. | |
| 2009/0193377 A1 * | 7/2009 | Puri et al. | 716/9 |
| 2012/0124539 A1 | 5/2012 | Alpert et al. | |

OTHER PUBLICATIONS

Cong, Jason, et al., "A Robust Detailed Placement for Mixed-Size IC Designs," Proc. of the 2006 Asia and South Pacific Design Automation Conference, pp. 188-194 (2006).

Lu, Yongqiang, et al., "Navigating Registers in Placement for Clock Network Minimization," Proc. 42$^{nd}$ Annual Design Automation Conf., pp. 176-181 (2005).

(Continued)

*Primary Examiner* — Binh Tat
(74) *Attorney, Agent, or Firm* — Steven L. Bennett; Jack V. Musgrove

(57) ABSTRACT

A latch placement tool determines a shape for a cluster of latches from a preliminary layout (or based on a netlist), including an aspect ratio of the shape, and generates a template for placement of the latches in conformity with the shape. Latches are placed around a local clock buffer (LCB) based on latch size, from largest latch first to smallest latch last, and based on their ideal locations given the target aspect ratio. The ideal locations may be further based on the clock driver pin configuration of the LCB. The final template preferably has an aspect ratio that is approximately equal to the aspect ratio of the shape of the cluster, but the latch placement may be constrained by clock routing topology. Latch placement within a cluster can be further optimized by swapping one of the latches with another to minimize total wirelength of the design.

25 Claims, 5 Drawing Sheets

(56) References Cited

OTHER PUBLICATIONS

Puri, Ruchir, et al., "Keeping Hot Chips Cool," Proc. 42$^{nd}$ Annual Design Automation Conf., pp. 285-288 (2005).

Shelar, Rupesh, "An Efficient Clustering Algorithm for Low Power Clock Tree Synthesis," Proc. 2007 Int'l. Symposium on Physical Design, pp. 181-188 (2007).

Venkataraman, Ganesh, et al, "Integrated Placement and Skew Optimization for Rotary Clocking," Proc. Conf. on Design, Automation and Test in Europe, pp. 756-761 (2006).

Venkateswaran, Natesan, et al., "Clock-Skew Constrained Placement for Row Based Designs," Proc. Int'l. Conf. on Computer Design: VLSI in Computers and Processors, pp. 219-220 (1998).

U.S. Appl. No. 13/275,105, filed Oct. 17, 2011, Kim et al.

* cited by examiner $$w_1/h_1 \approx w_2/h_2$$

STRUCTURED PLACEMENT OF LATCHES/FLIP-FLOPS TO MINIMIZE CLOCK POWER IN HIGH-PERFORMANCE DESIGNS

BACKGROUND OF THE INVENTION

1. Field of the Invention

The present invention generally relates to the design of semiconductor chips and integrated circuits, and more particularly to a method of designing the physical layout (placement) of latches or other logic cells which receive clock signals from clock distribution structures such as local clock buffers.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers (or more) of conducting media available for routing, such as a polysilicon layer and three metal layers (metal-1, metal-2, and metal-3). The polysilicon and metal layers are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn-around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

While current placement techniques provide adequate placement of cells with regard to their data interconnections, there is an additional challenge for the designer in constructing a clock network for the cells and this challenge is becoming more difficult in the context of modern technologies such as those used to design low-power integrated circuits in the 65-nanometer technology node and below. Low power circuits (e.g., around 20 watts or less for microprocessor chips) are becoming more prevalent due to power consumption problems. In particular, power dissipation has become a limiting factor for the yield of high-performance circuit designs (operating at frequencies around 1 gigahertz or more) fabricated in nanometer-scale technologies. Clock nets can contribute up to 50% of the total active power in multi-GHz designs. Low power designs are also preferable since they exhibit less power supply noise and provide better tolerance with regard to manufacturing variations.

There are several techniques for minimizing power while still achieving timing objectives for high performance, low power systems. One method involves the use of local clock buffers (LCBs) to distribute the clock signals to the clocked elements (latches/flip-flops) in the design. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, e.g., local logic circuits or latches. Since this clock network is one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

One popular approach to latch-LCB clustering is referred to as "huddle" placement. According to this method, latches are simply placed around the LCB to minimize overall latch-to-LCB wirelength. A typical huddle placement 2 is illustrated in FIG. 1A which shows two clusters of latches 4 huddled around respective LCB's 6, each LCB 6 driving its corresponding latches. A huddle placement has the particular benefit of being very compact, and usually is trivial to legalize (remove any overlap among the cells). A huddle placement also generally has good overall design routability. An alternative to the huddle approach is a structured placement technique wherein latches are rigidly placed along a highly controlled path as illustrated in FIG. 1B. The structured placement approach has certain advantages as well, including lower skew than a huddle placement and possibly better clock power, with a guarantee of no latch slew failures.

SUMMARY OF THE INVENTION

The present invention is generally directed to a method of designing a layout for a cluster of latches in a common clock domain of an integrated circuit, by determining a shape of the cluster in a preliminary layout, including an aspect ratio of the shape, generating a template for placement of the latches in conformity with the shape of the cluster in the preliminary layout, and placing the latches in the template around a local clock buffer. The cluster of latches can be identified based on layout features in a placement image of the preliminary layout. The template preferably has an aspect ratio that is approximately equal to the aspect ratio of the shape of the cluster, but the latch placement may be constrained by the clock routing topology. In the illustrative implementation, latches are placed around the local clock buffer in order based on latch size, from largest latch first to smallest latch last. Latch placement within a cluster can be further optimized by swapping one of the latches with another to minimize total wirelength of the overall layout.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

While existing approaches to latch clustering have certain benefits, they all still suffer other disadvantages. For example, while the huddle placement approach is more compact and is easily legalized, it places the latches around an LCB in an amorphous manner with no notion of a structure or regularity, which increases local congestion in and around the huddles. In addition, this approach does not pay any attention to the topology of the clock wires from the subsequent clock routing stage which can increase clock network wirelength after the clock routing stage, leading to higher clock wire capacitance (more power) as well as degraded skew. Structured placement can result in improved skew, power and slew compared to a huddle placement, but a structured placement is not compact, often cannot be legalized, and may hurt routability and overall wiring. It would, therefore, be desirable to devise an improved method of latch-LCB clustering which could retain benefits of both of these approaches, and avoid or mitigate their downsides. It would be further advantageous if the method could allow for local clock routing awareness during latch placement.

The present invention achieves these objectives by using a hybrid approach between huddle and structured placements which places the latches in a compact but structured configuration to optimize clock network wire length, power and design routability. This hybrid approach, referred to herein as structured huddle or Shuddle, places the latches according to a cluster-specific topology which is used to create a cluster template or configuration. The resulting design not only optimizes clock power and skew, but further creates a compact placement which reduces or minimizes routing congestion and design wirelength.

Figure 1A:
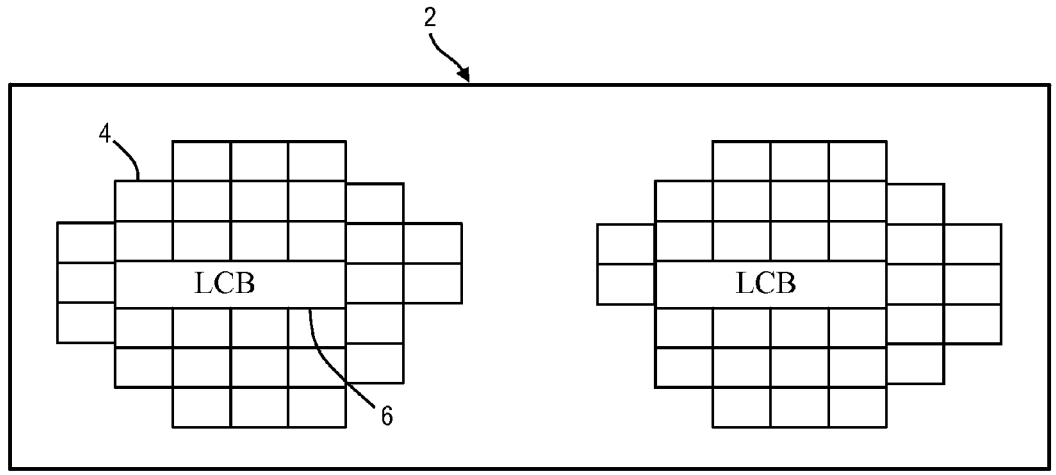
FIGS. 1A and 1B are plan views of conventional latch layouts referred to as huddle placement and structured placement.
Figure 1B:
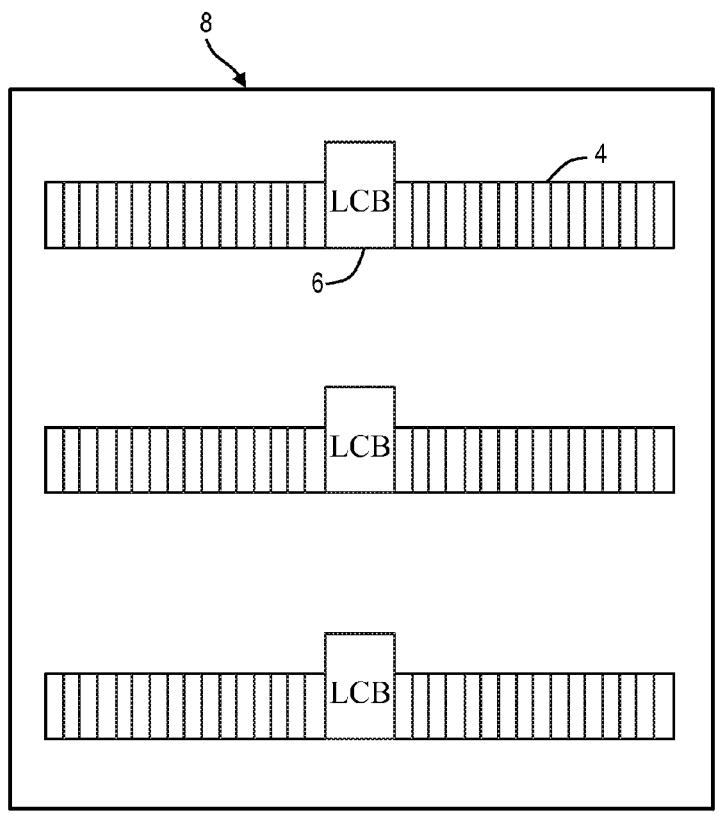
Figure 2:
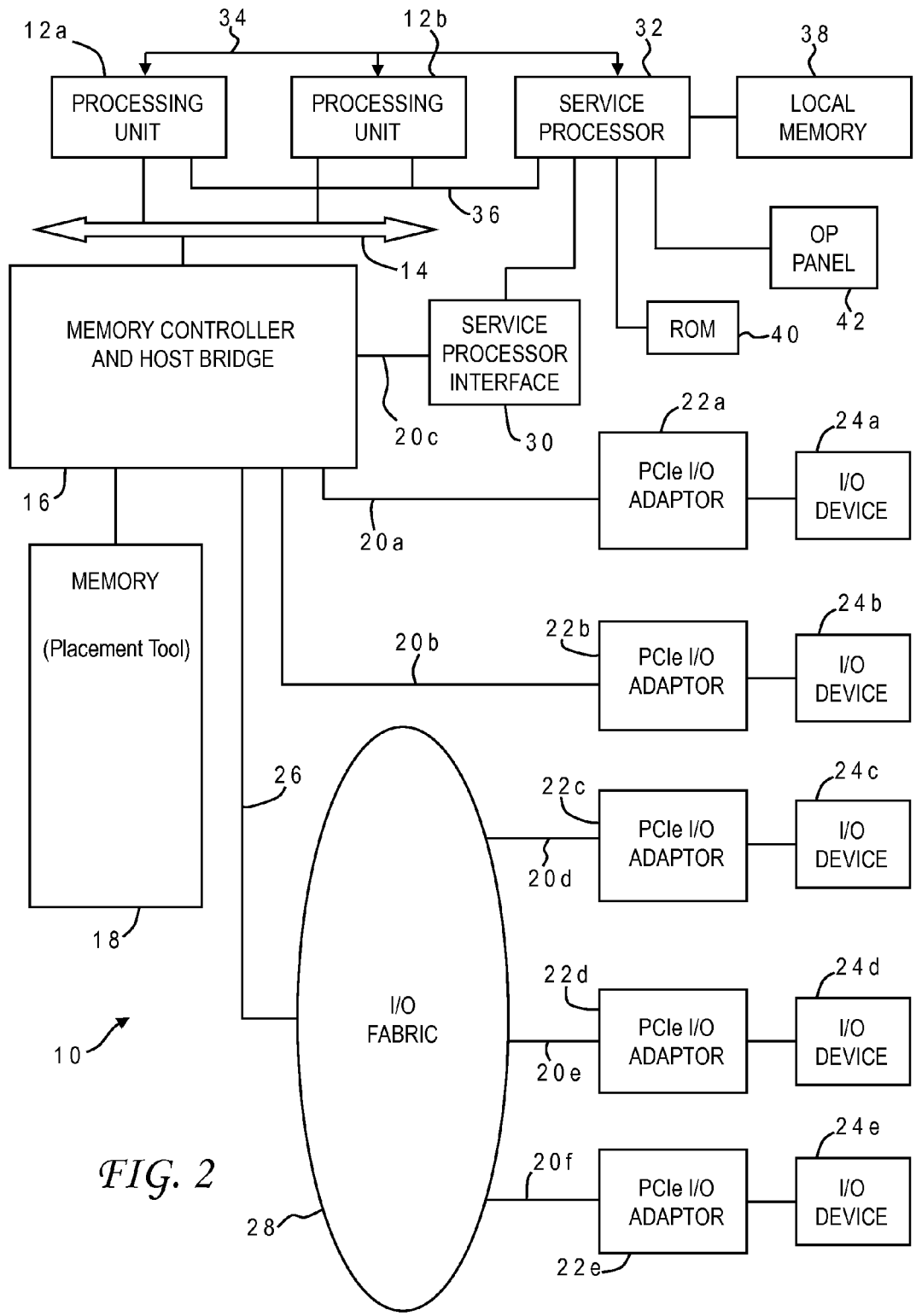
FIG. 2 is a block diagram of a computer system programmed to carry out integrated circuit design in accordance with one implementation of the present invention.

With reference now to the figures, and in particular with reference to FIG. 2, there is depicted one embodiment 10 of a computer system in which the present invention may be implemented to carry out the design of logic structures in an integrated circuit. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media such as propagating signals.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for a latch clustering process that uses novel placement techniques to optimize latch-LCB configurations. Accordingly, a program embodying the invention may include conventional aspects of various placement tools, and these details will become apparent to those skilled in the art upon reference to this disclosure.

Figure 3:
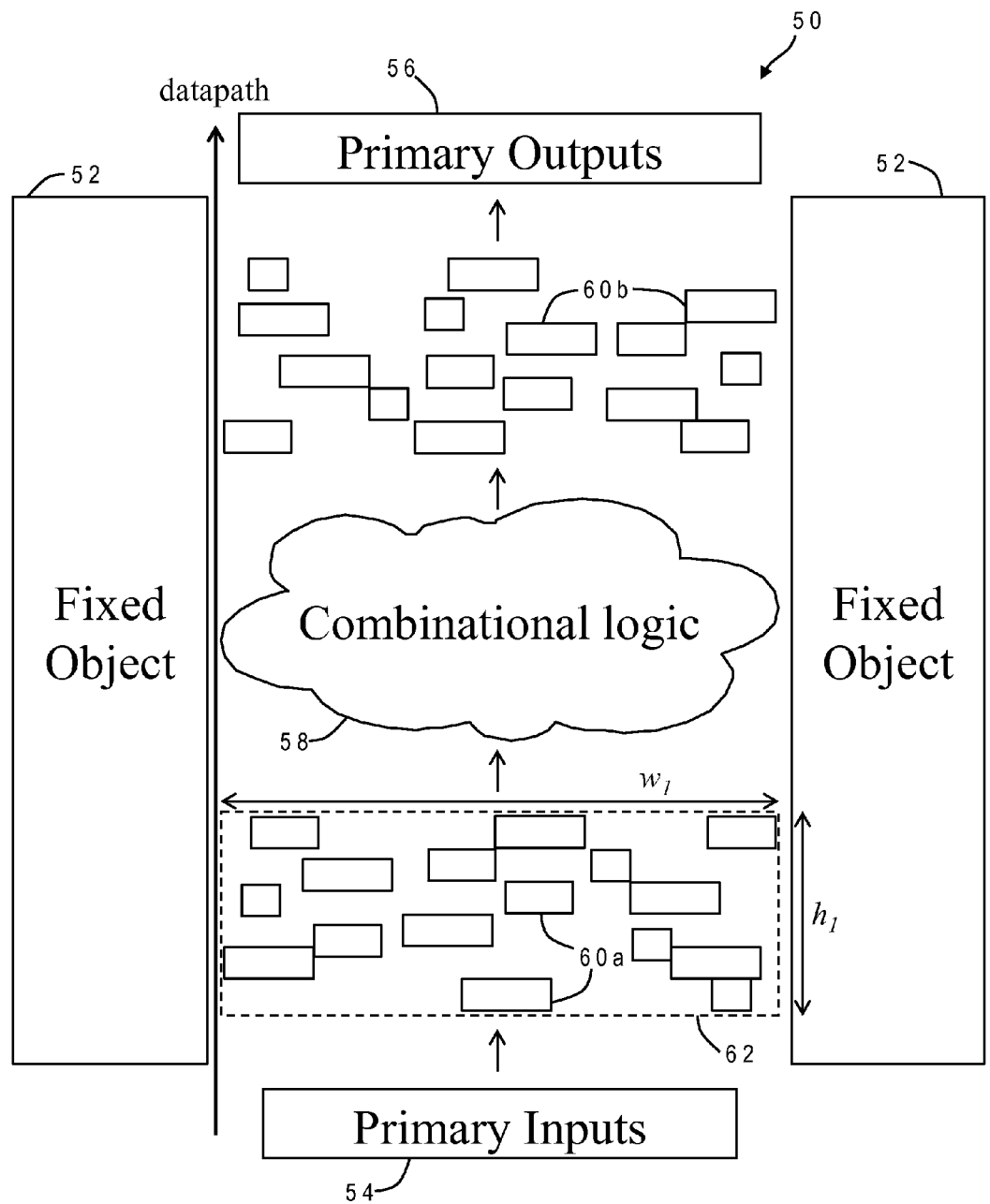
FIG. 3 is a plan view of a preliminary layout for a circuit design which includes sets of latches that will be grouped into clusters driven by respective LCB's in accordance with one implementation of the present invention.

Referring now to FIG. 3, there is depicted a preliminary layout 50 for a generalized integrated circuit design having digital logic including latches whose placement is to be optimized in accordance with the present invention. Layout 50 could be any layout including a random layout for the circuit elements, but in the illustrative embodiment it is provided by an electronic design automation (EDA) tool which locates all circuit elements, including latches or other clock sinks, in a region of the integrated circuit using for example quadratic placement. Other placement techniques may be used but quadratic placement often produces better results than alternatives such as min-cut based placement. In this example, layout 50 has fixed objects 52, a set of primary inputs 54, a set of primary outputs 56, combinational logic 58, a first set of latches 60a which receive values from primary inputs 54 and pass them on to combinational logic 58, and a second set of latches 60b which receive outputs of combinational logic 58 and pass them on to primary outputs 56. In this disclosure, the term "latch" refers generally to a variety of digital logic circuits, and not to any specific design. The latches may be for example flip-flop, master/slave, etc., but may also be other storage circuits such as memory cells or registers used to store a digital value. In the context of a circuit having a clock network, a latch can be any clock sink.

In a preliminary layout such as layout 50, latches may be placed in a particular way such that an identified cluster of latches has a characteristic shape. The shape may be influenced by obstructions such as fixed objects 52 which can create narrow alleys of latches. The shape may also be influenced by the direction of the datapath (based on the locations of primary inputs and primary outputs) which in the case of FIG. 3 is vertically oriented from bottom to top, resulting in two clusters of latches that have a generally elongated shape along the horizontal direction, i.e., a short/fat aspect ratio as opposed to a tall/skinny aspect ratio. The present invention attempts to preserve the characteristic shape of the latch cluster by using the shape to generate a template for a more compact placement of the latches around an LCB or other clock distribution structure.

Returning to the example of FIG. 3, the first set of latches 60a that interconnect primary inputs 54 to combinational logic 58 have been identified as a single cluster for purposes of latch-LCB clustering. This identification can be performed manually by the designer after inspecting the placement image of the preliminary layout, or can be performed by an EDA tool according to conventional clustering methods, such as those disclosed in U.S. Pat. Nos. 7,549,137 and 8,104,014. The EDA tool can be running on computer system 10 and can be separate from or include the latch placement tool, also running on computer system 10, which implements the present invention. Latches in a given cluster will be in a common clock domain.

The latch placement tool proceeds to determine a shape of the cluster including its aspect ratio. In more advanced implementations the shape may be selected from a variety of predetermined shapes include curved shapes such as circles or ellipses, or even compound shapes, but in the preferred implementation the latch placement tool looks for a rectilinear shape of the cluster, i.e., a rectangle whose height and width directions coincide with the Cartesian directions of the layout (vertical and horizontal). The aspect ratio can then be computed using a bounding box 62 surrounding the latches in the cluster. In drawing this bounding box, outlier latches can be removed from consideration, i.e., those latches that are placed far outside the bounds defined by the vast majority of the latches in the cluster. A latch can be designated as outlier based on different criteria. For example, if a latch is in a bin of the final partition of the preliminary layout which is adjacent to only empty bins, i.e., there are no latches in the adjacent bins, then it is probably an outlier latch. A formulaic approach may also be carried out automatically by computer system 10 which determines a cutoff distance from a centroid of the latches, i.e., any latch which is further than the cutoff distance is an outlier latch. In FIG. 3, bounding box 62 for latches 60a has a width $w_1$ and a height $h_1$, or an aspect ratio of $w_1/h_1$. The present invention will attempt to generate a corresponding template for latches 60a which preserves this aspect ratio.

FIGS. 4A-4E illustrate how the template might be generated for latches 60a. In this example, there are sixteen latches of varying sizes: small (four), medium (five), and large (seven). The present invention preferably places the latches around an LCB 70 in order based on size, from largest first to smallest last, and based on their ideal locations given the target aspect ratio. Since LCB 70 has a tall/skinny aspect ratio (not the short/fat shape of bounding box 62), the first several latches should be placed on either the left side or right side of the LCB (not on the bottom side or top side); quantitatively, the aspect ratio of the LCB standing alone is small compared to the target aspect ratio, so computer 10 is programmed to increase the template aspect ratio by increasing the width, that is, laying the next latch horizontally.

In choosing between the left and right sides, LCB pin locations can be used to further optimize latch placement. LCB 70 has three pins 72. The locations of pins 72 is generally biased toward the upper half of LCB 70, and two of the pins 72 lie close to the right side of LCB 70 while only one pin is close to the left side. Accordingly, the latch placement tool will choose the right side of LCB 70 for placement of the first latch (large size), since the right side is more heavily weighted by the LCB pin locations. The first latch could now be placed at either the upper right corner of LCB 70 or the lower right corner of LCB 70, and the top corner is chosen since the LCB pin locations weight more heavily toward the upper portion of LCB 70. The next two latches (large size) are placed directly underneath the first latch since the latch placement tool will fill in any available gaps within the current template bounding box (formed by the LCB and the first placed latch), placing each next latch as close as possible to the LCB. The intermediate result with the first three latches placed along the right side of LCB 70 is seen in FIG. 4A.

Figure 4A:
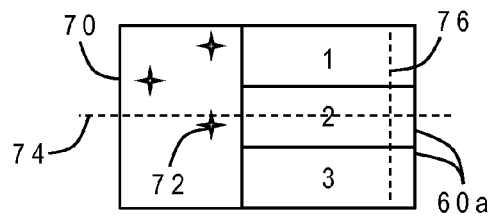
FIGS. 4A-4E are plan views illustrating the generation of a latch cluster template using a shape which is based on the shape of the latches in the cluster from the preliminary layout of FIG. 3 in accordance with one implementation of the present invention.

The aspect ratio of the intermediate template of FIG. 4A is still smaller than the target aspect ratio from bounding box 62, so the program instructions of the latch placement tool will again increase the template aspect ratio by increasing the width further, i.e., still placing the next set of latches horizontally rather than vertically. Computer system 10 will accordingly place the next three latches (large size) along the left side of LCB 70 as seen in FIG. 4B.

Figure 4B:
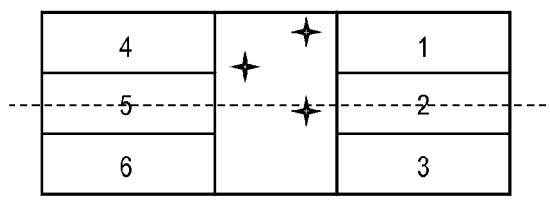

The aspect ratio of the intermediate template of FIG. 4B has now become larger than the target aspect ratio, so the latch placement tool will attempt to decrease the template aspect ratio by increasing the height, i.e., placing the next latch vertically, at either the top or bottom of LCB 70. Since LCB pin locations 72 are biased toward the upper half of LCB 70, the top side is selected for placement of the seventh latch (large size), immediately above the first placed latch. The next latch is again placed in the available location within the new template bounding box, as close as possible to the LCB, resulting in placement of the eighth latch (medium size) at the top of LCB 70 and along the left side, immediately above the fourth placed latch as seen in FIG. 4C.

Figure 4C:
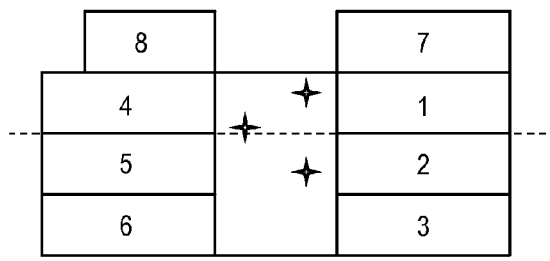

Since there are still more latches to place for this cluster, computer system 10 again analyzes the aspect ratio of the intermediate template of FIG. 4C and determines that it has returned to a small value as compared to the target aspect ratio, requiring the next set of latches to be placed horizontally. The right side of the layout is chosen based on LCB pin locations, and the next four latches (medium size) are laid out against the first four latches placed as seen in FIG. 4D.

Figure 4D:
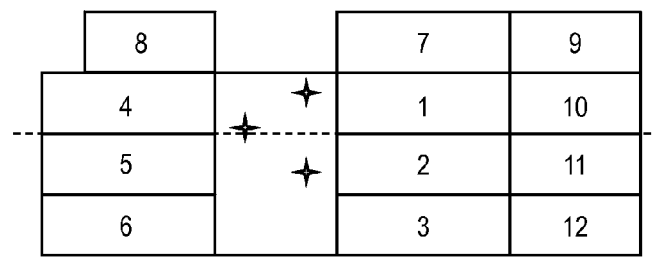
Figure 4E:
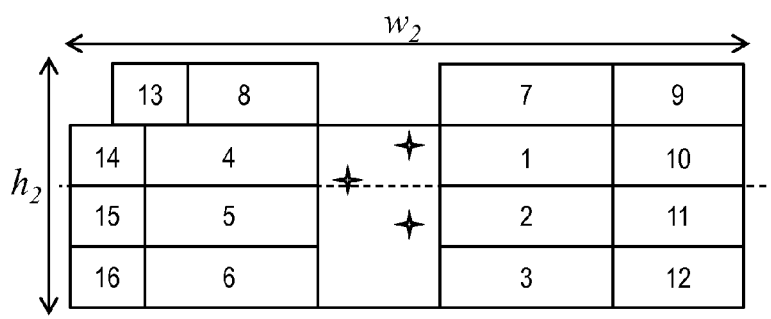

The aspect ratio of the intermediate template of FIG. 4D is still smaller than the target aspect ratio, so the last set of four latches (small size) will again be placed horizontally, this time along the left side of the template, as seen in FIG. 4E. The final result is a cluster template whose aspect ratio $w_2/h_2$ is approximately equal to the aspect ratio $w_1/h_1$ of the latch cluster from layout 50.

Clock routing topology may also be considered during template generation. The design may have constraints on the clock routing topology, such as the length of a clock interconnection. In the illustrative implementation, a main clock line (spine) 74 is established along a longitudinal centerline of the template, and branch lines (ribs) 76 are connected from the main clock line to each latch. The design constraints may require that the shorter branch lines are no longer than, for example, the height of three rows of the layout. In the final result of FIG. 4E, all of the placed latches are within this constraint since the branch lines would be at most two rows long. However, for any cluster template being generated, if the tool would otherwise choose a latch location that would violate this 3-row length limitation, then the tool will instead place the latch at a less favorable location but one that is within the branch length constraint. In other words, the latch placement tool will generate a template whose aspect ratio is as close as optimally possible to the aspect ratio of the cluster shape given the discrete sizes of the latches and LCB, and any other design parameters/constraints. Thus, the present invention generates a template for placement of the latches which is in conformity with the shape of the cluster from the preliminary layout.

Once the cluster template is finished, the completed shuddle design for this latch cluster can be located within layout 50. The shuddle may be located by designating a location for LCB 70, such as the center of bounding box 62, a centroid of latches in preliminary layout, or at favored locations as described in U.S. Pat. No. 8,104,014. If the final shuddle template does not fit in a specific location of the layout, alternative topologies can be used instead, including an amorphous (huddle) topology. After the shuddle is located within layout 50, latch placement can be further optimized, for example, using a cell transformation such as intra-cluster latch swapping. Any two latches within a shuddle template can be swapped, e.g., latch A is placed at a location of latch B and latch B is placed at a location of latch A. The objective is to minimize total wirelength of the overall design (layout 50).

If a template has been generated for a particular cluster topology that matches other clusters, then the same template can be used for the other clusters. For example, in FIG. 3 the second set of latches 60*b* interconnecting combinational logic 58 and primary outputs 56 are in a cluster that has a shape similar to the cluster formed by the first set of latches 60*a*. Since there are also sixteen latches 60*b*, this cluster can use the same template as the other set of latches (FIG. 4E).

While the preferred implementation uses a preliminary layout to discern a shape for the cluster, the present invention may also be applied without such a layout. The latch connectivity or logical hierarchy set forth in a netlist or other circuit description can be used to generate the clusters, and aspect ratios can be manually assigned by the designer or automatically selected based on predefined considerations. Each resulting shuddle can be placed in a subsequent layout using a global placement algorithm such as quadratic placement.

Figure 5:
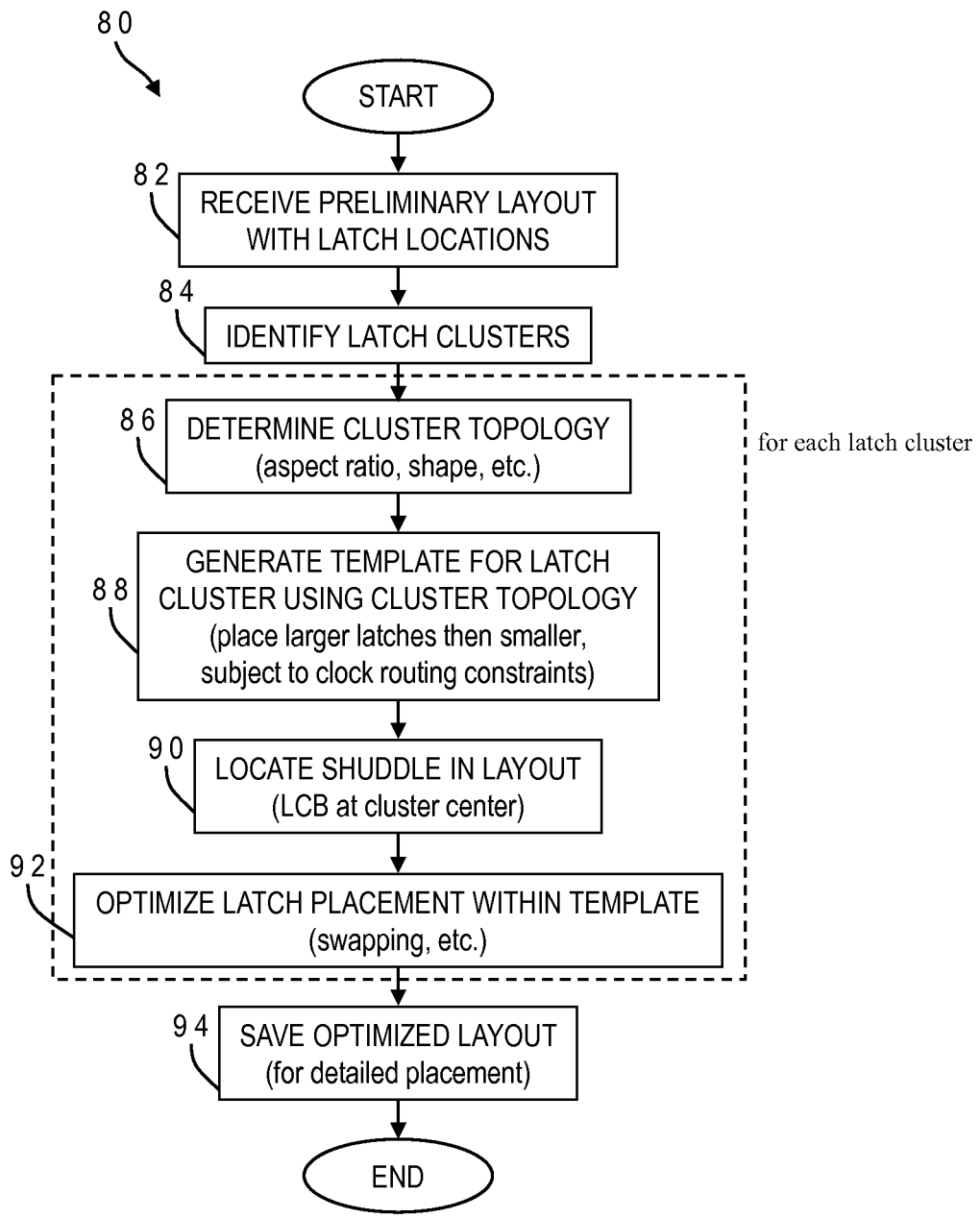
FIG. 5 is a chart illustrating the logical flow for a latch placement process in accordance with one implementation of the present invention.

The present invention may be further understood with reference to the chart of FIG. 5 which illustrates the logical flow for a latch placement process 80 in accordance with one implementation of the present invention. The process begins when the placement tool running on computer system 10 receives a preliminary layout of the circuit including latch locations (82). One or more clusters of the latches are identified (84). For each latch cluster, the cluster topology is determined (86), and a template for the latches is generated using the cluster topology, e.g., aspect ratio and shape (88). The shuddle (template with LCB and latches) is then located in the layout, i.e., replacing the latch locations (90). Latch placement within a given template is optimized to improve wirelength and routability (92). After these steps are completed for all clusters, the optimized layout is saved for further processing, such as detailed placement (94). The present invention thereby offers a latch clustering solution which is always compact and easy to legalize, but still has superior routability and low clock power, with a reliable skew and low probability of slew failures. The shuddle approach further allows the latch placement process to be local clock routing aware, and allows the designer to know the exact placement footprint for each latch cluster, improving solution quality and decreasing turn-around time.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of locating a cluster of latches in a common clock domain of an integrated circuit design, comprising:
   receiving a preliminary layout of the latches in the cluster, by executing first program instructions in a computer system;
   determining a shape of the cluster in the preliminary layout including an aspect ratio, by executing second program instructions in the computer system;
   generating a template for placement of the latches in conformity with the shape of the cluster in the preliminary layout, by executing third program instructions in the computer system; and
   placing the latches in the template around a local clock buffer, by executing fourth program instructions in the computer system.

2. The method of claim 1 wherein the template has an aspect ratio that is approximately equal to the aspect ratio of the shape of the cluster.

3. The method of claim 1 wherein said generating includes increasing a width of the template responsive to any determination that an aspect ratio of the template is smaller than the aspect ratio of the cluster in the preliminary layout, and increasing a height of the template responsive to any determination that the aspect ratio of the template is larger than the aspect ratio of the cluster in the preliminary layout.

4. The method of claim 1 wherein said placing places the latches around the local clock buffer in order based on latch size, from largest latch first to smallest latch last.

5. The method of claim 1 wherein said placing places the latches subject to clock routing constraints.

6. The method of claim 1 wherein said placing includes swapping one of the latches in the template with another one of the latches in the template to minimize total wirelength of the integrated circuit design.

7. The method of claim 1 further comprising identifying the cluster of latches based on layout features in a placement image of the preliminary layout.

8. A computer system comprising:
one or more processors which process program instructions;
a memory device connected to said one or more processors; and
program instructions residing in said memory device for locating a cluster of latches in a common clock domain of an integrated circuit design by receiving a preliminary layout of the latches in the cluster, determining a shape of the cluster in the preliminary layout including an aspect ratio, generating a template for placement of the latches in conformity with the shape of the cluster in the preliminary layout, and placing the latches in the template around a local clock buffer.

9. The computer system of claim 8 wherein the template has an aspect ratio that is approximately equal to the aspect ratio of the shape of the cluster.

10. The computer system of claim 8 wherein generating the template includes increasing a width of the template responsive to any determination that an aspect ratio of the template is smaller than the aspect ratio of the cluster in the preliminary layout, and increasing a height of the template responsive to any determination that the aspect ratio of the template is larger than the aspect ratio of the cluster in the preliminary layout.

11. The computer system of claim 8 wherein the latches are placed around the local clock buffer in order based on latch size, from largest latch first to smallest latch last.

12. The computer system of claim 8 wherein the latches are placed around the local clock buffer subject to clock routing constraints.

13. The computer system of claim 8 wherein one of the latches in the template is swapped with another one of the latches in the template to minimize total wirelength of the integrated circuit design.

14. The computer system of claim 8 wherein said program instructions further identify the cluster of latches based on layout features in a placement image of the preliminary layout.

15. A computer program product comprising:
a computer-readable storage medium; and
program instructions residing in said storage medium for locating a cluster of latches in a common clock domain of an integrated circuit design by receiving a preliminary layout of the latches in the cluster, determining a shape of the cluster in the preliminary layout including an aspect ratio, generating a template for placement of the latches in conformity with the shape of the cluster in the preliminary layout, and placing the latches in the template around a local clock buffer.

16. The computer program product of claim 15 wherein the template has an aspect ratio that is approximately equal to the aspect ratio of the shape of the cluster.

17. The computer program product of claim 15 wherein the template includes increasing a width of the template responsive to any determination that an aspect ratio of the template is smaller than the aspect ratio of the cluster in the preliminary layout, and increasing a height of the template responsive to any determination that the aspect ratio of the template is larger than the aspect ratio of the cluster in the preliminary layout.

18. The computer program product of claim 15 wherein the latches are placed around the local clock buffer in order based on latch size, from largest latch first to smallest latch last.

19. The computer program product of claim 15 wherein the latches are placed around the local clock buffer subject to clock routing constraints.

20. The computer program product of claim 15 wherein one of the latches in the template is swapped with another one of the latches in the template to minimize total wirelength of the integrated circuit design.

21. The computer program product of claim 15 wherein said program instructions further identify the cluster of latches based on layout features in a placement image of the preliminary layout.

22. A method of locating a cluster of clock sinks to be driven by a single clock distribution structure of an integrated circuit design, comprising:
receiving a preliminary layout of the clock sinks in the cluster, by executing first program instructions in a computer system;
assigning a rectilinear shape to the cluster using a bounding box which surrounds a majority of the clock sinks in the cluster, the bounding box having a width and a length defining an aspect ratio of the rectilinear shape, by executing second program instructions in the computer system;
generating a template for placement of the latches wherein the template has an aspect ratio that is approximately equal to the aspect ratio of the rectilinear shape, by executing third program instructions in the computer system; and
placing the latches in the template around a local clock buffer including swapping one of the latches in the template with another one of the latches in the template to minimize total wirelength of the integrated circuit design, by executing fourth program instructions in the computer system.

23. The method of claim 22 wherein the clock sinks are latches and the clock distribution structure is a local clock buffer.

24. The method of claim 22 wherein said placing places the clock sinks around the clock distribution structure in order based on clock sink size, from largest clock sink first to smallest clock sink last.

25. The method of claim 22 wherein said placing is based on a clock driver pin configuration of the clock distribution structure.

* * * * *